(12) United States Patent
Kim et al.

(10) Patent No.: US 10,436,520 B2
(45) Date of Patent: Oct. 8, 2019

(54) PLATE PULSATING HEAT SPREADER WITH ARTIFICIAL CAVITIES

(71) Applicant: KOREA ADVANCED INSTITUTE OF SCIENCE AND TECHNOLOGY, Daejeon (KR)

(72) Inventors: Sung Jin Kim, Daejeon (KR); Wookyoung Kim, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 0 days.

(21) Appl. No.: 15/941,625

(22) Filed: Mar. 30, 2018

(65) Prior Publication Data
US 2018/0283798 A1 Oct. 4, 2018

(30) Foreign Application Priority Data
Mar. 31, 2017 (KR) .................. 10-2017-0042138

(51) Int. Cl.
*F28D 15/02* (2006.01)
*F28D 15/04* (2006.01)
*H01L 23/427* (2006.01)

(52) U.S. Cl.
CPC ....... *F28D 15/0266* (2013.01); *F28D 15/025* (2013.01); *F28D 15/0233* (2013.01); *F28D 15/04* (2013.01); *H01L 23/427* (2013.01)

(58) Field of Classification Search
CPC ............ F28D 15/02; F28D 2015/0225; F28D 15/0266; F28D 15/0283; F28D 15/0233; F28D 15/025; F28D 15/043; F28D 1/0226; F28F 1/022; F28F 1/40; F28F 13/02; F28F 13/04; B23P 2700/09; F24J 2/32; G21C 15/257

USPC ..................................................... 165/104.29
See application file for complete search history.

(56) References Cited

U.S. PATENT DOCUMENTS

| | | | | | |
|---|---|---|---|---|---|
| 3,734,173 A | * | 5/1973 | Moritz | .................. | F28D 15/046 165/104.26 |
| 4,274,479 A | * | 6/1981 | Eastman | ............... | F28D 15/046 122/366 |
| 4,457,059 A | * | 7/1984 | Alario | ................... | B21C 37/151 165/104.26 |
| 4,470,451 A | * | 9/1984 | Alario | ................ | F28D 15/0233 122/366 |

(Continued)

FOREIGN PATENT DOCUMENTS

KR 1020110128539 A 11/2011

OTHER PUBLICATIONS

Kim, W. et al., "Effects of the artificial cavities on the startup performance of a pulsating heat pipes," Proceedings of the 2016 KSME Spring Conference, Apr. 19, 2016, Korea, 5 pages.

(Continued)

*Primary Examiner* — Orlando E Aviles
*Assistant Examiner* — Jose O Class-Quinones
(74) *Attorney, Agent, or Firm* — McCoy Russell LLP (57) ABSTRACT

The plate pulsating heat spreader according to the present disclosure may lower the degree of superheat to thereby allow nucleation to easily occur by including the cavities, thereby preventing a sudden temperature rise of an evaporator and having improved thermal performance. The pulsating heat spreader includes fluid channels and cavities.

7 Claims, 9 Drawing Sheets

(56) References Cited

U.S. PATENT DOCUMENTS

| | | | | | |
|---|---|---|---|---|---|
| 4,520,865 | A | * | 6/1985 | Bizzell | F28D 15/0233 122/366 |
| 5,642,775 | A | * | 7/1997 | Akachi | F28D 15/0233 165/104.14 |
| 5,697,428 | A | * | 12/1997 | Akachi | F28D 15/0233 165/104.14 |
| 5,803,165 | A | * | 9/1998 | Shikazono | F28F 1/124 165/133 |
| 2001/0003308 | A1 | * | 6/2001 | Li | F28D 9/0062 165/104.33 |
| 2002/0000312 | A1 | * | 1/2002 | Brand | F28F 13/187 165/179 |
| 2002/0096314 | A1 | * | 7/2002 | Liu | B21C 37/20 165/133 |
| 2003/0192674 | A1 | * | 10/2003 | Ippoushi | F28D 15/0233 165/104.21 |
| 2007/0068657 | A1 | * | 3/2007 | Yamamoto | F28D 15/0233 165/104.26 |
| 2008/0087406 | A1 | * | 4/2008 | Asfia | F28D 15/0233 165/104.29 |
| 2008/0185130 | A1 | * | 8/2008 | Fang | F28D 1/05383 165/140 |
| 2009/0211095 | A1 | * | 8/2009 | Zheng | B21C 37/151 29/890.032 |
| 2009/0229806 | A1 | * | 9/2009 | Lu | B21C 37/26 165/177 |
| 2011/0108142 | A1 | * | 5/2011 | Liu | H01L 23/427 137/561 R |
| 2013/0133871 | A1 | * | 5/2013 | Ma | F28D 15/0266 165/185 |
| 2015/0316329 | A1 | * | 11/2015 | Lang | F28F 1/40 165/133 |
| 2016/0018166 | A1 | * | 1/2016 | Ahamed | F28D 15/04 165/104.26 |

OTHER PUBLICATIONS

Kim, W., "Effect of artificial cavities on the thermal performance of pulsating heat pipes," Master's Thesis, Korea Advanced Institute of Science and Technology, Jan. 4, 2017, 63 pages.

* cited by examiner

FIG. 1

(PRIOR ART)

FIG. 2

(PRIOR ART)

PLATE PULSATING HEAT SPREADER WITH ARTIFICIAL CAVITIES

CROSS-REFERENCE TO RELATED APPLICATIONS

This disclosure claims priority under 35 U.S.C. § 119 to Korean Patent Application No. 10-2017-0042138, filed on Mar. 31, 2017, in the Korean Intellectual Property Office, the disclosure of which is incorporated herein by reference in its entirety.

TECHNICAL FIELD

The following disclosure relates to a plate pulsating heat spreader with artificial cavities.

BACKGROUND

As electronic devices are recently miniaturized and integrated, a structural space for a cooling system is becoming very limited and narrow. Accordingly, a demand for the cooling system capable of dissipating heat at high efficiency within the narrow space is increased.

Figure 1:
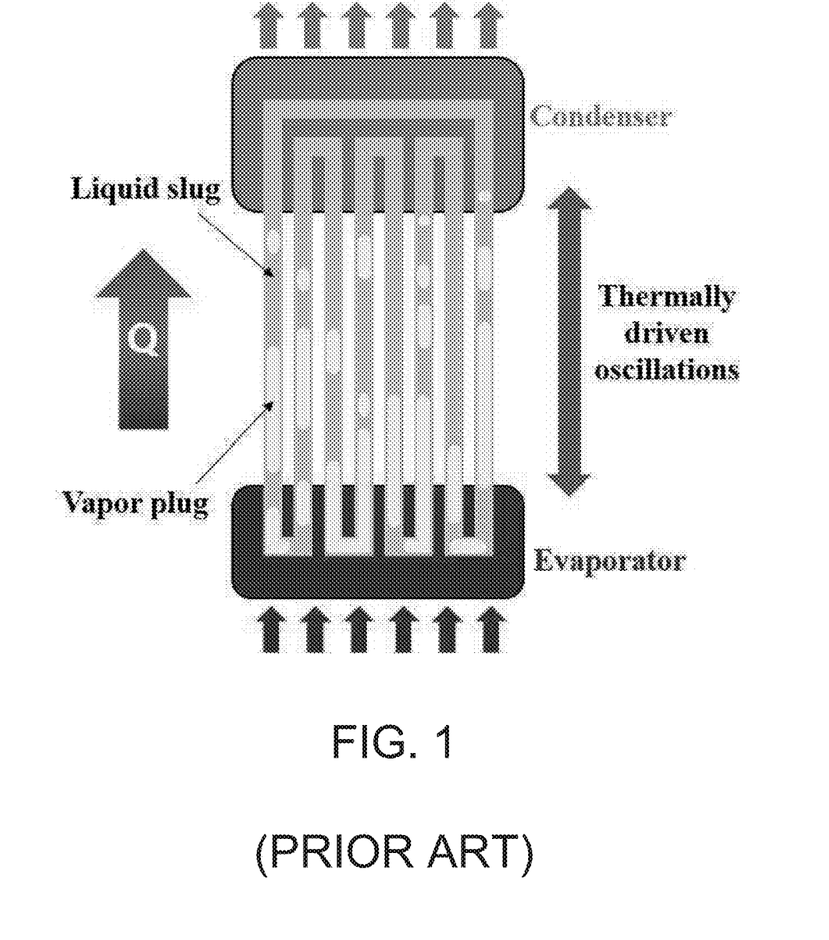
FIG. 1 is a schematic view illustrating a typical pulsating heat pipe.

As a heat dissipating device or a cooling device, a heat pipe is mainly used. A typical heat pipe includes an empty space and a wick structure. The thinner the heat pipe, the narrower the space in which a vaporized working fluid moves due to the wick structure thereof, which results in a rapid decrease in performance thereof. Therefore, there is a limit in applying the heat pipe to ultra-thin electronic devices. To overcome the above-mentioned problem, a pulsating heat pipe is proposed. As illustrated in FIG. 1, the pulsating heat pipe includes a smooth micro tube bundle without the wick structure, and an aligned slug-train unit including a liquid slug and a vapor plug in the tube pulsates and transfers heat. The pulsating heat pipe may be manufactured to be thin because it does not have the wick structure therein and has a simple structure, which is suitable for application to microelectronic devices.

Figure 2:
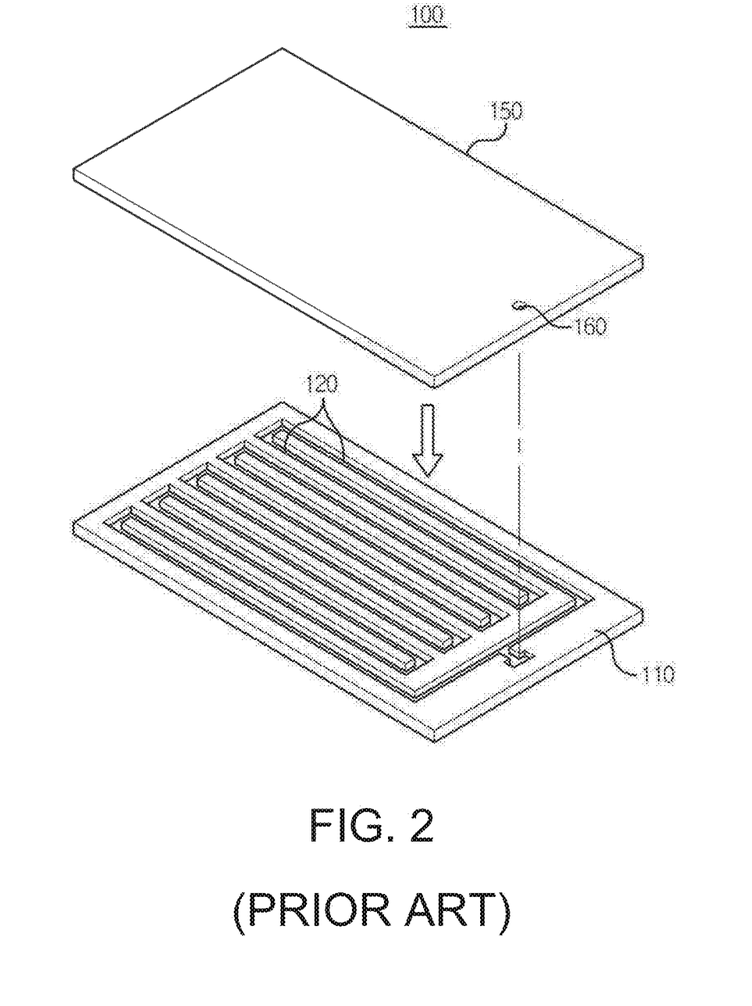
FIG. 2 is a schematic view of a conventional flat heat disperser.

As illustrated in FIG. 2, Korean Patent Publication No. 2011-0128539 discloses a flat heat disperser including a first substrate, a second substrate which is closely coupled to the first substrate, a channel formed in a closed loop of a zigzag or spiral shape on at least one surface of the surfaces on which the first substrate and the second substrate are coupled to each other, and an injection hole formed in a portion of the first substrate or the second substrate to inject a coolant into the channel.

Such a plate pulsating heat pipe allows to self-pulsate a working fluid therein due to a pressure difference of the vapor plugs existing in an evaporator and a condenser and transfers heat from the evaporator to the condenser. However, if nucleation that generates the vapor plug in the evaporator is not properly performed, the pulsating heat pipe does not properly operate, which may cause a problem in that a temperature of the evaporator suddenly rises. In particular, in a case in which the pulsating heat pipe is used at a low heat input, a temperature overshoot phenomenon in which the temperature of the evaporator is higher than a normal operation occurs, which may cause a problem in the electronic device or durability of the electronic device to be weakened.

SUMMARY

An embodiment of the present disclosure is directed to providing a plate pulsating heat spreader capable of preventing a rapid temperature increase of an evaporator by including artificial cavities within a channel of the plate pulsating heat spreader to thereby lower the degree of superheat and to allow nucleation to easily occur.

Another embodiment of the present disclosure is directed to providing a plate pulsating heat spreader having improved thermal performance by changing a size and an arrangement of cavities.

In one general aspect, a pulsating heat spreader into which a working fluid is injected includes a flat lower plate; a capillary tube including a plurality of channels formed on an upper surface of the lower plate along a length direction of the lower plate while having a predetermined depth, wherein the channels are bent and connected to each other at both ends of the lower plate to form a closed loop; and an upper plate coupled to an upper side of the lower plate to seal the capillary tube, wherein a plurality of cavities are formed in side walls of the channels heated by an external heat source positioned on a lower surface of the lower plate.

The plurality of cavities may be disposed to be spaced apart from each other by a predetermined interval in a length direction on the side walls of the channels, and each of the cavities may be formed in the side walls of the channels in a vertical direction.

A size of the cavity may be different from a size of an adjacent cavity.

The cavity may include an inlet which is opened at a predetermined width from the side wall of the channel to an inside of the side wall of the channel, and a hallow having a circular cross section shape having a diameter greater than the width of the inlet toward an inside of the inlet.

The width of the inlet may be 10 to 40 μm.

The cavities may be further formed in bottom surfaces of the channels or a portion of the upper plate facing the bottom surfaces of the channels.

In another general aspect, a pulsating heat spreader into which a working fluid is injected includes a flat base part; a capillary tube including a plurality of channels penetrating through the base part in a vertical direction and formed along a length direction of the base part, wherein the channels are bent and connected to each other at both ends of the base part to form a closed loop; an upper film bonded to an upper portion of the base part; and a lower film bonded to a lower portion of the base part to seal the channels, wherein a plurality of cavities are formed in side walls of the channels heated by an external heat source positioned on a lower surface of the lower film.

The plurality of cavities may be disposed to be spaced apart from each other by a predetermined interval in a length direction on the side walls of the channels, and each of the cavities may be formed in the side walls of the channels in a vertical direction.

A size of the cavity may be different from a size of an adjacent cavity.

The cavity may include an inlet which is opened at a predetermined width from the side wall of the channel to an inside of the side wall of the channel, and a hallow having a circular cross section shape having a diameter greater than the width of the inlet toward an inside of the inlet.

The width of the inlet may be 10 to 40 μm.

BRIEF DESCRIPTION OF THE DRAWINGS

FIGS. 1-4, 8, and 9 are shown approximately to scale.

[Detailed Description of Main Elements]

| | |
|---|---|
| 100: plate pulsating heat spreader according to first exemplary embodiment | |
| 101: evaporator | 105: condenser |
| 110: lower plate | 120: channel |
| 125: capillary tube | 130: side wall of channel |
| 140: cavity | 141: inlet |
| 142: hollow | 150: upper plate |
| 200: plate pulsating heat spreader according to second exemplary embodiment | |
| 201: evaporator | 205: condenser |
| 210: base part | 220: channel |
| 225: capillary tube | 230: side wall of channel |
| 240: cavity | 250: upper film |
| 260: lower film | |

DETAILED DESCRIPTION OF EMBODIMENTS

Hereinafter, a plate pulsating heat spreader with artificial cavities according to the present disclosure will be described with reference to the accompanying drawings.

Figure 3:
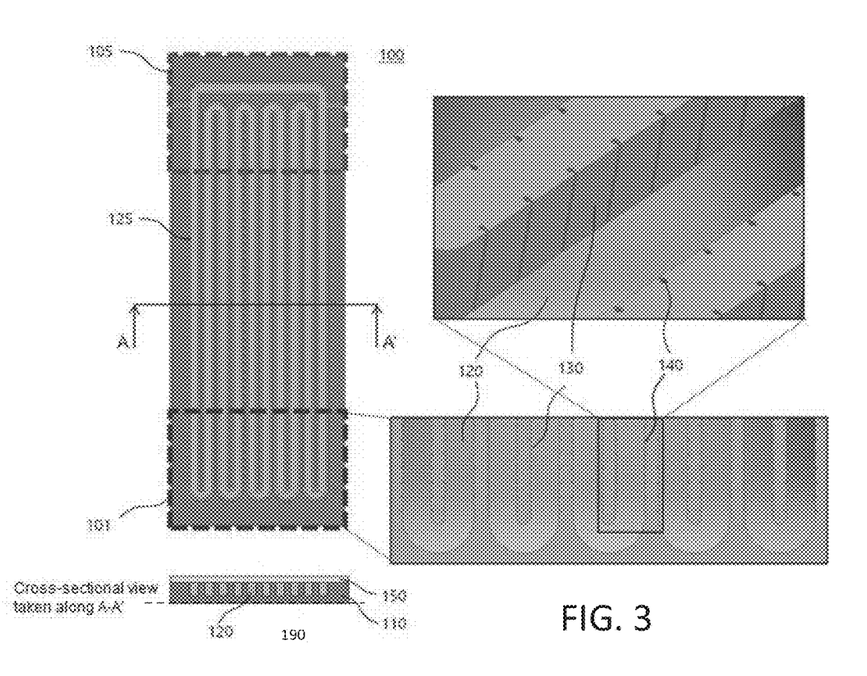
FIG. 3 is a schematic view of a plate pulsating heat spreader with artificial cavities according to a first exemplary embodiment of the present disclosure.

FIG. 3 is a schematic view of a plate pulsating heat spreader 100 with artificial cavities according to a first exemplary embodiment of the present disclosure. The plate pulsating heat spreader 100 into which a working fluid is injected according to the present exemplary embodiment includes a flat lower plate 110; a capillary tube 125 including a plurality of channels 120 formed on an upper surface of the lower plate 110 along a length direction of the lower plate while having a predetermined depth, wherein the channels are bent and connected to each other at both ends of the lower plate 110 to form a closed loop; and an upper plate 150 coupled to an upper side of the lower plate 110 to seal the capillary tube 125, wherein a plurality of cavities 140 are formed in side walls 130 of the channels 120 heated by an external heat source 190 positioned on a lower surface of the lower plate 110.

As illustrated in a cross-sectional view taken along a line A-A' in a left lower end of FIG. 3, the lower plate 110 and the upper plate 150 may be closely coupled to each other in a pair to keep the closed loop formed on the lower plate 110 in a vacuum state.

The upper plate 110 and the lower plate 150 are illustrated as quadrangular thin plates, but may be variously formed according to a required form in consideration of an installation space in an electronic device.

In addition, the upper plate 110 and the lower plate 150 may be formed of various materials of a semiconductor material such as silicon, a polymer material such as plastic, a metal material such as copper having high heat conductivity, ceramic, and a flexible material having elasticity, and the like.

In the plate pulsating heat spreader illustrated in a left upper end of FIG. 3, an external heat source generating heat is positioned at a lower portion of the plate pulsating heat spreader such that an evaporator 101 in which the heat spreader absorbs the heat is positioned at the lower portion of the heat spreader, and a condenser 105 discharging the heat to the outside is positioned at an upper portion of the heat spreader. The plurality of channels formed on the lower plate 110 are formed in a direction from the evaporator 101 to the condenser 105, and are bent and connected to each other at the evaporator 101 and the condenser 105 to form the closed loop. The evaporator 101, the condenser 105, and the channel formation direction may be formed as illustrated in FIG. 3, but also changed as needed.

A predetermined amount of working fluid may be filled in the channels 120 and the working fluid may be injected through an injection hole (not shown) formed in the lower plate 110 or the upper plate 150.

As illustrated in FIG. 3, the channels 120 are grooves formed in the upper surface of the lower plate 110 at a predetermined width and depth, and a cross section thereof has a quadrangular shape. In this case, the channel 120 includes side walls 130 disposed at left and right sides thereof, a bottom surface, and a portion of the upper plate 150 facing the bottom surface. The cross-section of the channel 130 may also be formed in a half circle shape or a 'V' shape, as needed.

One embodiment of the pulsating heat spreader operates as follows. In the channels 120 of the evaporator 101 heated by the external heat source, if a specific temperature condition between the channels 120 and the working fluid is satisfied, nucleation occurs. As a result, vapors are generated and gradually become larger. Thereafter, a vapor plug generated from the evaporator 120 is moved to the condenser 105 of low pressure, is condensed in the condenser 105 having a low temperature, and disappears. When the pulsating heat spreader normally operates, the nucleation continuously occurs in the evaporator 101, and the vapor plug transfers heat from the heat source 190 to the condenser 105 while self-pulsating the working fluid in the pulsating heat spreader due to a pressure difference.

Figure 6:
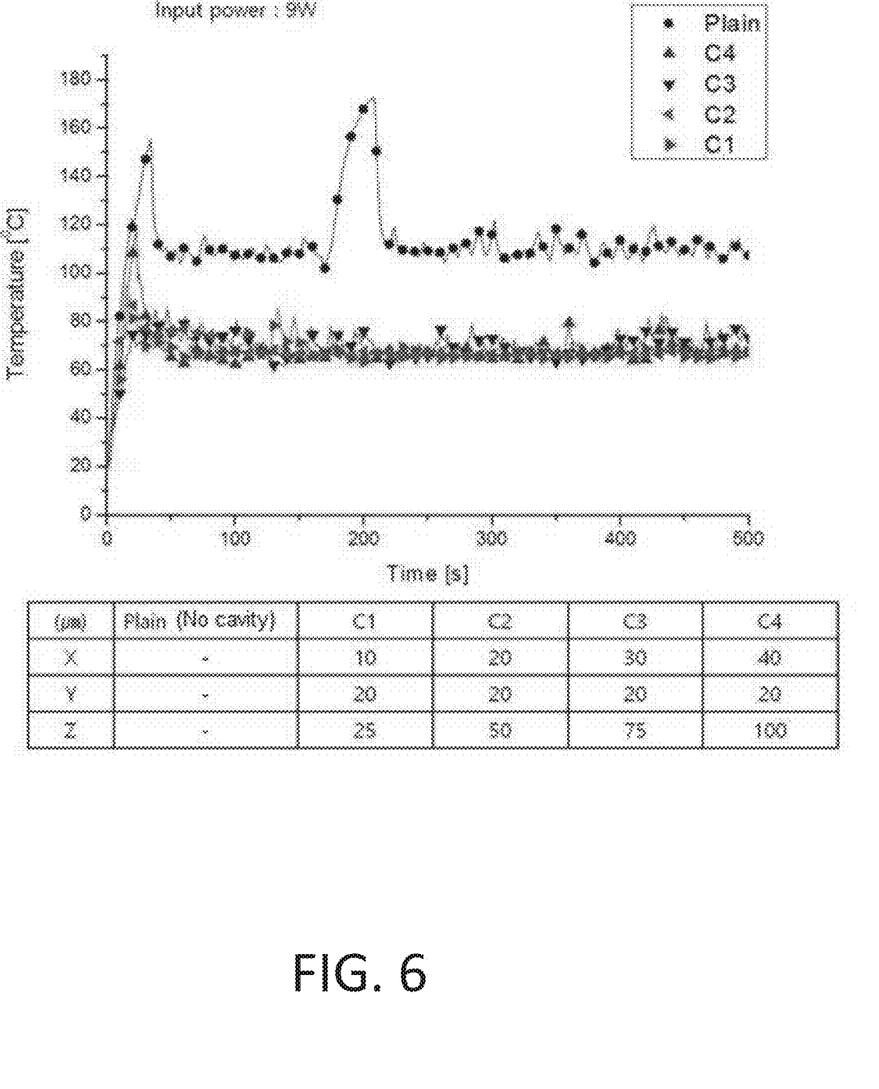
FIG. 6 is a graph illustrating a temperature of an evaporator of the plate pulsating heat spreader with artificial cavities according to the present disclosure.

Since the working fluid is not moved until the pulsating heat spreader normally operates, that is, the nucleation occurs in the channel, the heat of the evaporator 101 is transferred to the condenser 105 primarily by conduction. As a result, the temperature of the evaporator 101 may suddenly rise. As illustrated in FIG. 6, it may be confirmed that an initial temperature of the evaporator suddenly rises up to about 150° C. when there are no cavities. Such a sudden temperature rise may cause a problem in the electronic device or weaken durability.

According to the present disclosure, by forming artificial cavities in the channels 120 of the evaporator 101, the degree of superheat is lowered in the evaporator 101, such that the nucleation may easily occur. Thereby, it is possible to prevent the temperature of the evaporator 101 from suddenly rising before the pulsating heat spreader normally operates, and it is also possible to increase thermal performance of the pulsating heat spreader.

The evaporator 101 of the pulsating heat spreader is illustrated in detail in a right lower end of FIG. 3, and a plurality of cavities 140 may be formed in side walls 130 of the channels. The cavities 140 may also be formed in side walls of the channels positioned on the condenser 105 or other insulation part as well as the side walls of the channel 120 positioned on the evaporator 101. In addition, the cavities may be further formed in bottom surfaces of the channels or a portion of the upper plate facing the bottom surfaces of the channels, shown in FIG. 9.

As seen from the evaporator 101 illustrated in the right lower end of FIG. 3, the plurality of cavities 140 may be disposed to be spaced apart from each other by a predetermined interval in a length direction on the side walls 130 of the channels.

Figure 9:
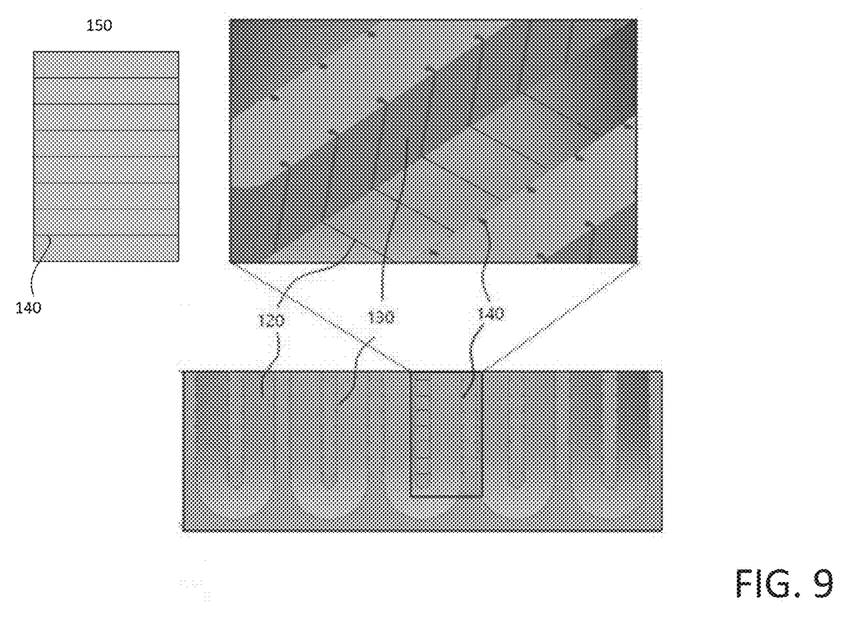
FIG. 9 is a schematic view of a plate pulsating heat spreader with artificial cavities according to a first exemplary embodiment of the present disclosure.

As seen from an enlarged evaporator 101 illustrated in the right upper end of FIG. 3, each of the cavities 140 may be formed in the side walls 130 of the channels in a vertical direction. Unlike FIG. 3, the cavities 140 may be formed in a portion of the side walls 130 of the channels in the vertical direction. In addition, the cavities formed in the side walls of the channels may be connected to the cavities formed in the bottom surfaces of the channels or the portion of the upper plate facing the bottom surfaces of the channels. An embodiment including cavities 140 in the bottom surfaces and upper plate is shown in FIG. 9.

A cross section of each of the cavities 140 may be formed in a quadrangular shape, a triangular shape, or various shapes. As an example, an artificial cavity 140 illustrated in FIG. 4 may include an inlet 141 which is opened at a predetermined width from the side wall 130 of the channel to an inside of the side wall of the channel, and a hallow 142 having a circular cross section shape having a diameter greater than the width of the inlet toward an inside of the inlet 141. Here, the diameter of the hollow 142 may be greater two times or more than the width of the inlet 141. The circular hollow may have a trapezoidal shape.

Figure 4:
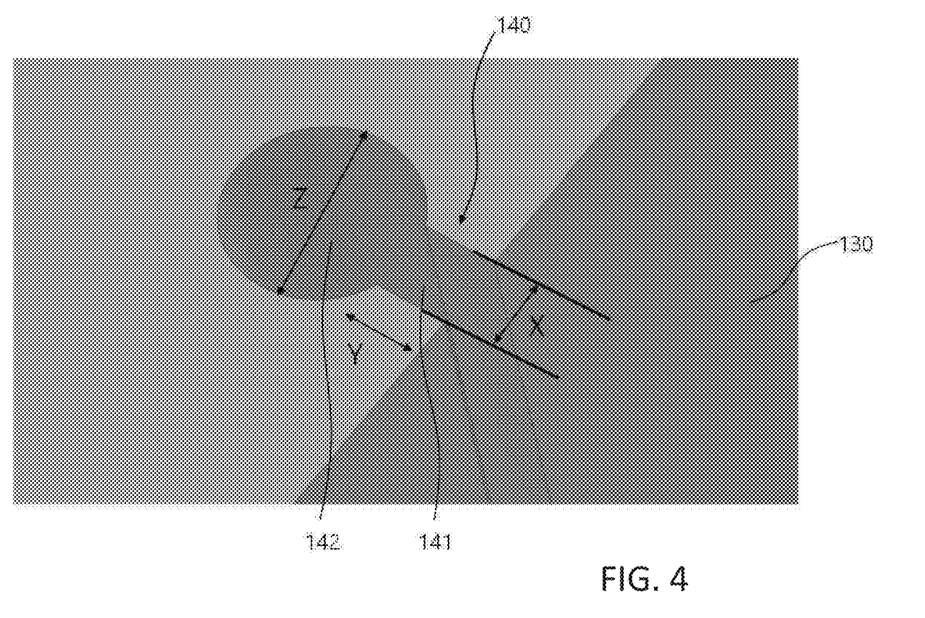
FIG. 4 is a schematic view of an artificial cavity according to the present disclosure.

A size of the cavity 140 may be expressed by the width of the inlet 141 of the cavity, a depth of the cavity, and the like. The cavity 140 may have various shapes including the width of the inlet 141 which is opened from the side wall 130 of the channel to the inside of the side wall of the channel. The size of the cavity may often be expressed by the width of the inlet 141.

The width of the inlet 141 of the cavity 140 is determined by Equation 1 below and is varied according to a kind of working fluid and the set degree of superheat.

$$\Delta T_{SAT,ONB} = T_{WALL} - T_{SAT} = \frac{1.1 r_c q''}{k_L \sin\theta} + \frac{2\sigma \sin\theta}{r_c} \frac{T_{SAT}}{\rho_V h_{LV}} \quad \text{[Equation 1]}$$

Here, $r_c$ is a half value of the width of the inlet of the cavity, $q''$ is a heat flux, $k_L$ is thermal conductivity of the working fluid, $\theta$ is a contact angle between the working fluid and the channel, $\sigma$ is surface tension of the working fluid, $\rho_V$ is density of vapor, $h_{LV}$ is latent heat required during evaporation, and $\Delta T_{SAT,ONB}$ represents the degree of superheat, which is a difference between a temperature $T_{WALL}$ and a saturation temperature of the working fluid.

When quantity of input heat is about 5 to 15 W, which is generally used, the width of the inlet of the cavity may be 10 to 40 μm. In this case, the degree of superheat has a minimum value of about 5 degrees, and since the degree of superheat is low, the nucleation easily occurs. Thereby, it is possible to prevent the temperature of the evaporator 101 from suddenly rising before the pulsating heat spreader normally operates, and it is also possible to increase thermal performance of the pulsating heat spreader.

In the pulsating heat spreader according to the present disclosure, the temperature and thermal performance of the evaporator were measured according to the size of the cavity 140. The upper plate 110 is formed of Pyrex glass, the lower plate 150 is formed of a silicon material, five rectangular channels having a width of 1 mm and a depth of 0.5 mm were formed using a deep reactive ion etching process. Ethanol was used as the working fluid, and an experiment was performed under a condition in which a filling rate is 50%. As illustrated in the Table at a lower end of FIG. 6, the width of the inlet 141 of the cavity 140 was manufactured with 10, 10, 30, and 40 μm, and the cavity is formed in the evaporator 101.

FIG. 6 is a graph illustrating a temperature of an evaporator of the plate pulsating heat spreader with artificial cavities according to the present disclosure. It may be seen that when there is no cavity, an initial temperature of the evaporator suddenly rises up to about 150° C., while when there is the cavity, the initial temperature of the evaporator is significantly low. In particular, when the width of the inlet is 30 μm, the temperature of the evaporator is about 80° C., which is merely a half of the case in which there is no cavity.

Figure 7:
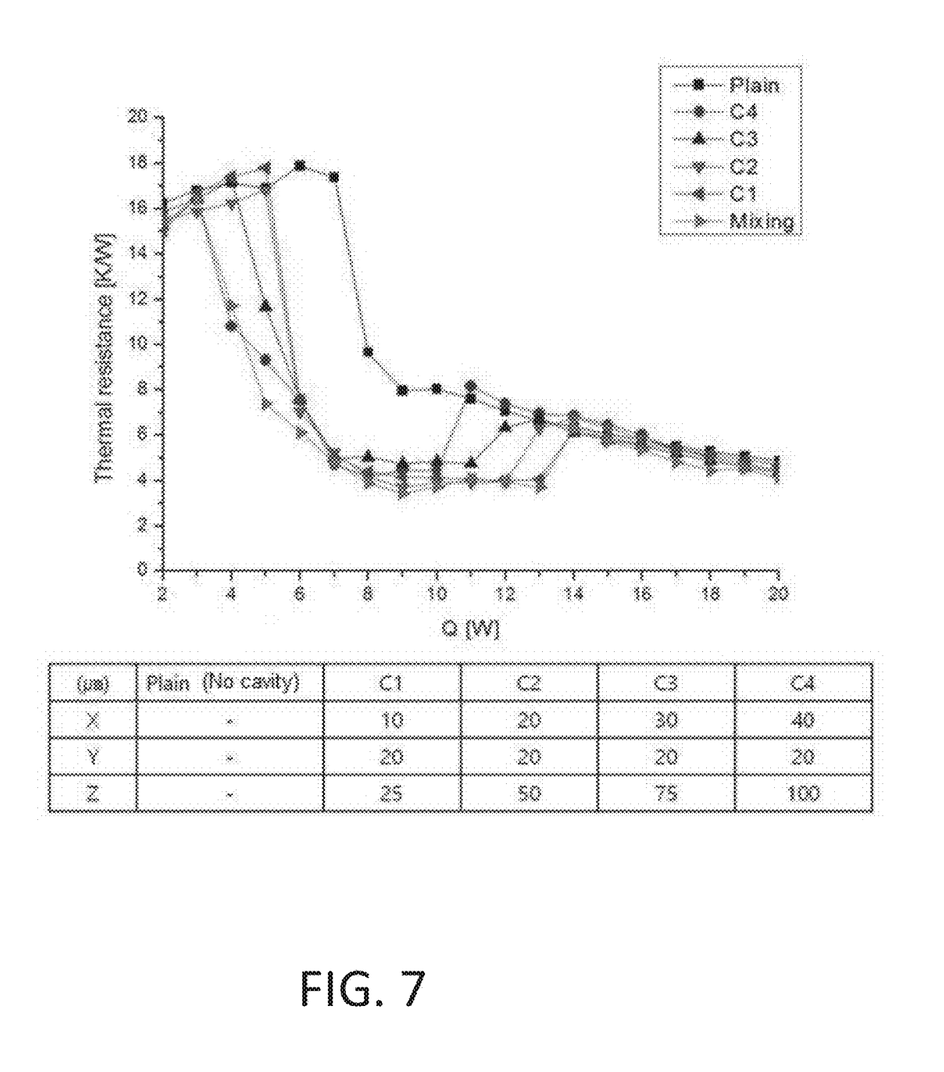
FIG. 7 is a graph illustrating thermal resistance of the plate pulsating heat spreader with artificial cavities according to the present disclosure.

FIG. 7 is a graph illustrating thermal resistance of the plate pulsating heat spreader with artificial cavities according to the present disclosure. As the thermal resistance is lower, the thermal performance is excellent. Therefore, it may be seen that the thermal resistance is lower in a case in which there is a cavity as compared to a case in which there is no cavity. This shows that the degree of superheat is lowered due to the cavity and the nucleation easily occurs, which improves the thermal performance of the pulsating heat spreader.

Figure 5:
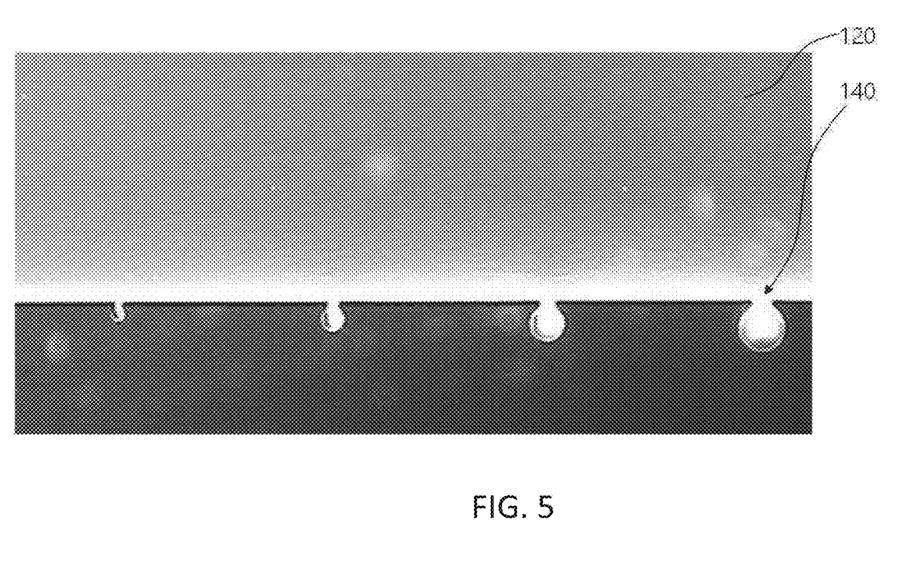
FIG. 5 is a photograph of artificial cavities having various sizes according to the present disclosure.

In the plate pulsating heat spreader with the artificial cavities according to the present disclosure, the plurality of cavities 140 formed in the evaporator 101 are characterized in that sizes of adjacent cavities are different from each other. As illustrated in FIG. 7, in a case in which the width of the inlet is 40 μm, it may be seen that the thermal resistance is lower than other cases at low quantity of input heat, but the thermal resistance is higher than other cases at quantity of input heat of 11 W or more. That is, when the size of the cavity is constant, the thermal resistance is relatively low in the case in which the quantity of input heat is low, while the thermal resistance is relatively increased in the case in which the quantity of input heat is high. As illustrated in FIG. 5, the sizes of the adjacent cavities were manufactured to be different from each other by repeatedly changing the width of the inlet of the cavity to 10, 20, 30, and 40 μm, and the thermal resistance was measured. As illustrated in the result of the mixing of FIG. 7, in the case in which the sizes of the adjacent cavities are different from each other, the thermal resistance is relatively low in a case in which the quantity of input heat is low and the thermal resistance is relatively lowered even in a case in which the quantity of input heat is high, which shows the best thermal performance as a whole.

Figure 8:
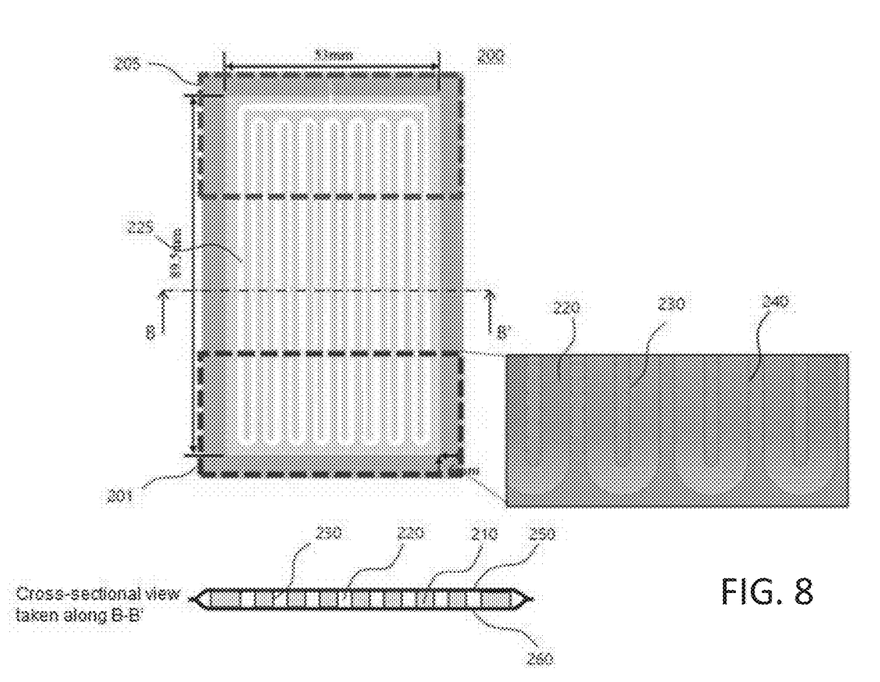
FIG. 8 is a schematic view of a plate pulsating heat spreader with artificial cavities according to a second exemplary embodiment of the present disclosure.

FIG. 8 is a schematic view of a plate pulsating heat spreader 200 with artificial cavities according to a second exemplary embodiment of the present disclosure. The plate pulsating heat spreader 200 into which a working fluid is injected according to the present exemplary embodiment includes a flat base part 210; a capillary tube 225 including a plurality of channels 220 penetrating through the base part 210 in a vertical direction and formed along a length direction of the base part 110, wherein the channels 220 are bent and connected to each other at both ends of the base part 210 to form a closed loop; an upper film 250 bonded to an upper portion of the base part 210; and a lower film 260 bonded to a lower portion of the base part 210 to seal the channels 220, wherein a plurality of cavities 240 are formed in side walls 230 of the channels 220 heated by an external heat source positioned on a lower surface of the lower film 260.

As illustrated in a cross-sectional view taken along a line B-B' in a lower end of FIG. 8, the upper film 260 and the lower film 260 may be closely coupled to the upper and lower surfaces of the base part 210, respectively to keep the closed loop formed on the base part 210 in a vacuum state. Here, the upper film 250 and the lower film 260 include a metal layer to prevent permeation of gas, thereby keeping the vacuum state.

The second exemplary embodiment of the present disclosure differs from the first exemplary embodiment in that a basic structure of the pulsating heat spreader is formed by the base part, the upper film, and the lower film, and the content related to the cavity, which is the characteristic of the present disclosure, is applied thereto in the same way.

The plurality of cavities 240 may be formed in the side walls 230 of the channels positioned on a portion corresponding to the evaporator 201 of the pulsating heat spreader according to the second exemplary embodiment. The cavities 240 may also be formed in side walls of the channels positioned on the condenser 205 or other insulation part as well as the side walls of the channel 220 positioned on the evaporator 201.

The plurality of cavities 240 may be disposed to be spaced apart from each other in a length direction in the side walls 230 of the channels formed on the base part 210, and each of the cavities 240 may be formed in the side walls 230 of the channels in a vertical direction.

In addition, a cross section of each of the cavities may be formed in a quadrangular shape, a triangular shape, or various shapes. The cavity 240 may include an inlet which is opened at a predetermined width from the side wall of the channel 230 formed on the base part 210 to an inside of the side wall of the channel, and a hallow having a circular cross section shape having a diameter greater than the width of the inlet toward an inside of the inlet. Here, a diameter of the hollow may be greater two times or more than the width of the inlet. The circular hollow may have a trapezoidal shape.

In the case of quantity of input heat of about 5 to 15 W which is generally used, the width of the inlet of the cavity may be 10 to 40 μm.

In the plate pulsating heat spreader with the artificial cavities according to the second exemplary embodiment, the plurality of cavities 240 formed in the evaporator 201 are characterized in that sizes of adjacent cavities are different from each other.

The cavities may also be formed in the upper film 250 and the lower film 260, but since the upper and lower films are thin films, it may be difficult to form the cavities in surfaces of the upper and lower films.

As described above, the plate pulsating heat spreader according to the present disclosure may lower the degree of superheat to thereby allow the nucleation to easily occur by including the artificial cavities within the channel of the pulsating heat spreader. Thereby, the rapid temperature increase of the evaporator is prevented before the pulsating heat spreader is normally operated, thereby making it possible to prevent the failure of the electronic device and to improve durability thereof.

In addition, since the plate pulsating heat spreader may have the improve thermal performance as compared to the conventional pulsating heat spreader by changing the size and the arrangement of the cavities, the size of the cooling system of the electronic device may be further reduced and the cooling may be more effectively performed. As a result, the plate pulsating heat spreader may be used in the miniaturized and integrated electronic device.

The present disclosure has been described with reference to the exemplary embodiments, and those skilled in the art will be able to implement exemplary embodiments other than the exemplary embodiments of the present disclosure described in the detailed description of the present disclosure within the technical scope of the present disclosure. The technical scope of the present disclosure should be defined by the following claims, and all technical spirits equivalent to the following claims should be interpreted as being included in the present disclosure.

What is claimed is:

1. A pulsating heat spreader into which a working fluid is injected, the pulsating heat spreader comprising:
   a flat lower plate;
   a capillary tube including a plurality of channels formed on an upper surface of the lower plate along a length direction of the lower plate while having a predetermined depth, wherein the channels are bent and connected to each other at both ends of the lower plate to form a closed loop; and
   an upper plate coupled to an upper side of the lower plate to seal the capillary tube, wherein a plurality of cavities are formed in side walls of the channels heated by an external heat source positioned on a lower surface of the lower plate;
   the plurality of cavities are disposed to be spaced apart from each other by a predetermined interval in a length direction on the side walls of the channels, and each of the cavities is formed in the side walls of the channels in a vertical direction; and
   a size of each cavity of the plurality of cavities is different from a size of a respective adjacent cavity of the plurality of cavities.

2. The pulsating heat spreader of claim 1, wherein at least a selected cavity of the plurality of cavities includes an inlet which is opened at a predetermined width from the side wall of a respective selected channel of the plurality of channels to an inside of the side wall of the respective selected channel, and a hallow having a circular cross section shape having a diameter greater than the width of the inlet toward an inside of the inlet.

3. The pulsating heat spreader of claim 2, wherein the width of the inlet is 10 to 40 μm.

4. The pulsating heat spreader of claim 1, wherein the cavities are further formed in bottom surfaces of the channels or a portion of the upper plate facing the bottom surfaces of the channels.

5. A pulsating heat spreader into which a working fluid is injected, the pulsating heat spreader comprising:
   a flat base part;
   a capillary tube including a plurality of channels penetrating through the base part in a vertical direction and formed along a length direction of the base part, wherein the channels are bent and connected to each other at both ends of the base part to form a closed loop; and
   an upper film bonded to an upper portion of the base part; and a lower film bonded to a lower portion of the base part to seal the channels, wherein a plurality of cavities are formed in side walls of the channels heated by an external heat source positioned on a lower surface of the lower film;

the plurality of cavities are disposed to be spaced apart from each other by a predetermined interval in a length direction on the side walls of the channels, and each of the cavities is formed in the side walls of the channels in a vertical direction; and a size of each cavity of the plurality of cavities is different from a size of a respective adjacent cavity of the plurality of cavities.

6. The pulsating heat spreader of claim 5, wherein at least a selected cavity of the plurality of cavities includes an inlet which is opened at a predetermined width from the side wall of a respective selected channel of the plurality of channels to an inside of the side wall of the respective selected channel, and a hallow having a circular cross section shape having a diameter greater than the width of the inlet toward an inside of the inlet.

7. The pulsating heat spreader of claim 6, wherein the width of the inlet is 10 to 40 μm.

* * * * *